(12) United States Patent
Stephan

(10) Patent No.: US 11,937,392 B2
(45) Date of Patent: Mar. 19, 2024

(54) BOW CABLE MANAGEMENT SYSTEM

(71) Applicant: Robert Stephan, Mesa, AZ (US)

(72) Inventor: Robert Stephan, Mesa, AZ (US)

(*) Notice: Subject to any disclaimer, the term of this patent is extended or adjusted under 35 U.S.C. 154(b) by 0 days.

(21) Appl. No.: 17/748,962

(22) Filed: May 19, 2022

(65) Prior Publication Data

US 2023/0380093 A1    Nov. 23, 2023

(51) Int. Cl.
  *F41B 5/14*     (2006.01)
  *F41G 1/467*    (2006.01)
  *H05K 7/02*     (2006.01)

(52) U.S. Cl.
  CPC .............. *H05K 7/02* (2013.01); *F41B 5/148* (2013.01); *F41G 1/467* (2013.01)

(58) Field of Classification Search
  CPC .......... F41B 5/14; F41B 5/1403; F41B 5/148; F41B 5/1492; F41G 1/467; H05K 7/02
  USPC .................................. 124/86, 87, 88; 33/265
  See application file for complete search history.

(56) References Cited

U.S. PATENT DOCUMENTS

| | | | | |
|---|---|---|---|---|
| 3,945,127 A * | 3/1976 | Spencer | ................... | F41G 1/467 42/132 |
| 4,134,383 A * | 1/1979 | Flood | ....................... | F41B 5/14 340/815.4 |
| 4,179,613 A * | 12/1979 | Koren | ....................... | F41B 5/14 124/87 |
| 4,325,190 A * | 4/1982 | Duerst | ..................... | F41G 1/467 33/366.27 |
| 4,454,858 A * | 6/1984 | Henry | ....................... | F41B 5/14 124/44.6 |
| 4,617,741 A * | 10/1986 | Bordeaux | ............... | F41G 1/473 124/87 |
| 4,689,887 A * | 9/1987 | Colvin | .................... | F41G 1/467 124/87 |
| 4,741,320 A * | 5/1988 | Wiard | ................... | F41B 5/1476 124/88 |
| 4,813,150 A * | 3/1989 | Colvin | .................... | F41G 1/467 42/132 |
| 5,060,626 A * | 10/1991 | Elliott | ................... | F41B 5/1434 124/900 |
| 5,122,932 A * | 6/1992 | Ziller | ...................... | F41G 1/467 124/87 |
| 5,140,972 A * | 8/1992 | Fisk | ........................ | F41B 5/143 124/44.5 |

(Continued)

*Primary Examiner* — Alexander R Niconovich
(74) *Attorney, Agent, or Firm* — Schmeiser, Olsen & Watts LLP

(57) ABSTRACT

A bow cable management system is provided. The system includes a bow management device, a bow and an electronic accessory. The bow management device includes a base member and a bracket, wherein the base member has a first side and an opposing second side with a recess formed on the second side. A first channel extends from the recess out a front end of the base member, and a second channel extends from the recess out the bottom side of the base member. The bow management device is coupled to a riser of the bow. The electronic accessory is coupled to the bracket of the cable management device. The cable management device is configured to receive a cable of the electronic accessory through first channel with a portion of the cable retained within the recess of the base member and then extending through the second channel to a trigger accessory.

8 Claims, 7 Drawing Sheets

(56) References Cited

U.S. PATENT DOCUMENTS

| | | | | |
|---|---|---|---|---|
| 5,143,044 A * | 9/1992 | Bourquin | F41B 5/1488 | 124/88 |
| 5,152,068 A * | 10/1992 | Meister | F41G 1/467 | 124/87 |
| 5,205,268 A * | 4/1993 | Savage | F41B 5/14 | 124/44.5 |
| 5,243,957 A * | 9/1993 | Neilson | F41B 5/1469 | 124/31 |
| 5,243,959 A * | 9/1993 | Savage | F41B 5/14 | 124/31 |
| 5,435,068 A * | 7/1995 | Thames | F41G 1/467 | 124/87 |
| 5,575,072 A * | 11/1996 | Eldridge | F41G 1/467 | 124/87 |
| 5,914,775 A * | 6/1999 | Hargrove | G01C 3/08 | 356/3.13 |
| 5,934,267 A * | 8/1999 | Briner | F41B 5/14 | 124/88 |
| 6,029,120 A * | 2/2000 | Dilger | F41B 5/14 | 324/179 |
| 6,073,352 A * | 6/2000 | Zykan | G01S 17/88 | 33/DIG. 21 |
| 6,952,881 B2 * | 10/2005 | McGivern | F41G 1/30 | 124/87 |
| 7,255,035 B2 * | 8/2007 | Mowers | F41B 5/1492 | 89/41.17 |
| 7,337,773 B2 * | 3/2008 | Simo | F41B 5/143 | 124/44.5 |
| 7,487,594 B2 * | 2/2009 | Labowski | F41G 1/467 | 124/87 |
| 7,647,922 B2 * | 1/2010 | Holmberg | F41B 5/14 | 124/88 |
| 8,024,884 B2 * | 9/2011 | Holmberg | F41B 5/1492 | 42/124 |
| 8,156,680 B2 * | 4/2012 | Holmberg | F41G 11/003 | 348/376 |
| 8,161,674 B2 * | 4/2012 | Holmberg | F41C 27/00 | 42/124 |
| 8,240,077 B2 * | 8/2012 | Holmberg | F41G 11/003 | 42/114 |
| 8,272,137 B2 * | 9/2012 | Logsdon | F41G 1/345 | 124/87 |
| 8,276,282 B2 * | 10/2012 | Mainsonneuve | F41G 1/467 | 124/87 |
| 8,316,551 B2 * | 11/2012 | Gorsuch | F41G 1/467 | 124/87 |
| 8,336,216 B2 * | 12/2012 | Samuels | G01C 3/06 | 124/87 |
| 8,387,608 B2 * | 3/2013 | Morris, II | F41B 5/1403 | 124/25.6 |
| 8,528,535 B2 * | 9/2013 | Morris, II | F41B 5/1403 | 124/25.6 |
| 8,656,624 B2 * | 2/2014 | Holmberg | F41B 5/1492 | 42/124 |
| 8,656,625 B2 * | 2/2014 | Holmberg | G03B 29/00 | 124/44.5 |
| 8,826,551 B2 * | 9/2014 | Gibson | F41G 1/345 | 124/87 |
| 8,899,220 B2 * | 12/2014 | Morris, II | F41B 5/10 | 124/23.1 |
| 9,568,278 B1 * | 2/2017 | Jordan | F41G 1/467 | |
| 9,797,686 B2 * | 10/2017 | Chesney | F41G 1/467 | |
| 9,970,730 B2 * | 5/2018 | Thacker, Jr. | F41B 5/1434 | |
| 10,030,936 B2 * | 7/2018 | Brasseur | F41G 1/467 | |
| 10,088,276 B2 * | 10/2018 | Lohan | F41G 1/467 | |
| 11,719,505 B2 * | 8/2023 | Trpkovski | F41C 23/20 | 124/88 |
| 2010/0043765 A1 * | 2/2010 | Lang | F41B 5/1403 | 124/88 |
| 2020/0333101 A1 * | 10/2020 | Bushman | F41B 5/1403 | |

\* cited by examiner

BOW CABLE MANAGEMENT SYSTEM

BACKGROUND OF THE INVENTION

Technical Field

This invention relates generally to cable management and more particularly to a bow cable management system for organizing and managing cables of an electronic accessory mountable to a bow.

State of the Art

The use of electronic accessories on bows is becoming increasingly popular. For example, a popular electronic accessory is a rangefinder, such as a rangefinder incorporated with a bow sight. These electronic accessories often require a trigger to initiate operation of the electronic accessory. As with all electronic accessories, particularly ones with triggers, there are cables that need to connect the components. Conventional means of managing the cables include straps or tape that hold the cables to the bow riser and so forth. There is not a system that exists for managing such cables.

Accordingly, there is a need for a bow cable management system that allows for managing the cables of electronic accessories mounted to a bow.

SUMMARY OF THE INVENTION

An embodiment includes a bow cable management system comprises comprising: a bow management device comprising: a base member comprising: a first side and an opposing second side; a bottom side and a top side; a front end and a rear end; and a recess extending into the base member from the second side; and a bracket extending from the first side of the base member and located at the first end of the base member; a first channel formed in the base member extending from the recess out a front end of the base member; and a second channel formed in the base member extending from the recess out the bottom side of the base member; and a bow having a bridge-lock slot formed in a riser of the bow, wherein the bow management device is coupled within the bridge-lock slot formed in the riser of the bow, wherein: the bracket of the cable management device is configured to couple to an electronic accessory, wherein the cable management device is configured to receive a cable of the electronic accessory through the first channel with a portion of the cable retained within the recess of the base member and then the cable extending through the second channel to a trigger accessory.

Another embodiment includes a method of using a cable management system, the method comprising: coupling a bow cable management device to a bow riser with at least one cable having a portion retained within a recess of the bow cable management device, a first end of the cable extending through a first channel formed in the bow cable management device and a second end of the cable extending through a second channel of the bow cable management device; coupling an electronic accessory to the bow cable management device; coupling a first end of the cable to the electronic accessory; and coupling a second end of the cable to a trigger accessory.

Another embodiment includes a bow cable management system comprises comprising: a bow management device comprising: a base member comprising: a first side and an opposing second side; a bottom side and a top side; a front end and a rear end; and a recess extending into the base member from the second side; and a bracket extending from the first side of the base member and located at the first end of the base member; a first channel formed in the base member extending from the recess out a front end of the base member; and a second channel formed in the base member extending from the recess out the bottom side of the base member; and a bow having a riser, wherein the bow management device is coupled to the riser of the bow or another location of the bow, wherein: the bracket of the cable management device is configured to couple to an electronic accessory, wherein the cable management device is configured to receive a cable of the electronic accessory through the first channel with a portion of the cable retained within the recess of the base member and then the cable extending through the second channel to a trigger accessory.

The foregoing and other features and advantages of the present invention will be apparent from the following more detailed description of the particular embodiments of the invention, as illustrated in the accompanying drawings.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF EMBODIMENTS OF THE INVENTION

Figure 1:
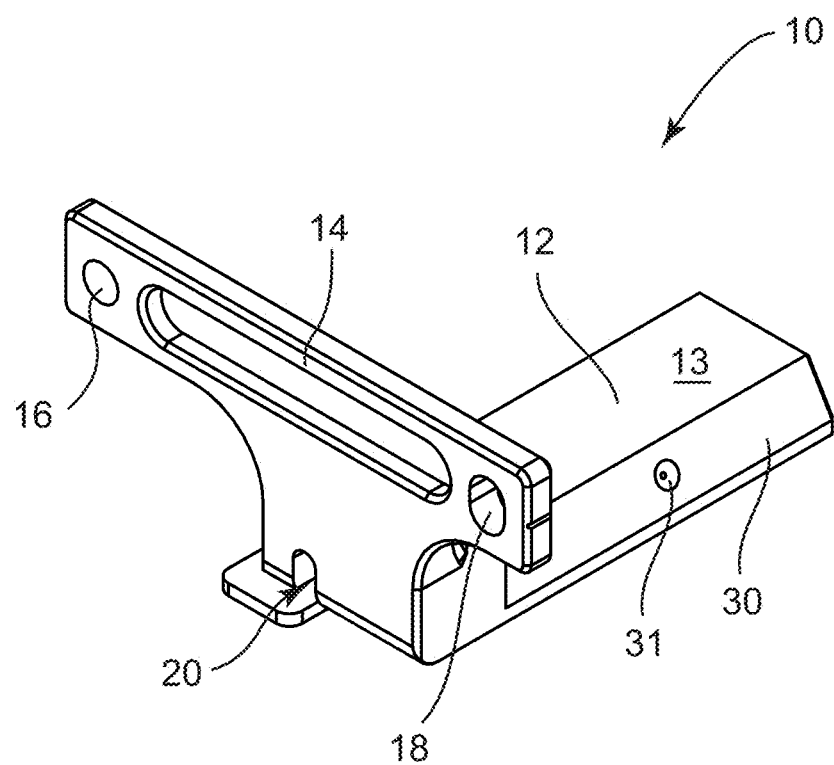
FIG. 1 is a perspective view of a bow cable management device according to an embodiment.
Figure 2:
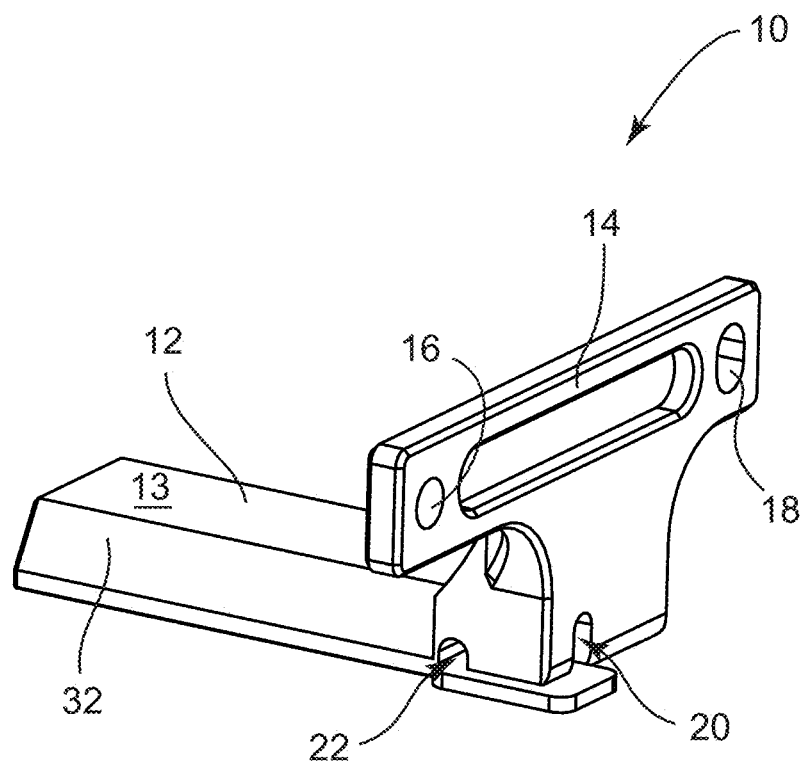
FIG. 2 is another perspective view of a bow cable management device according to an embodiment.
Figure 3:
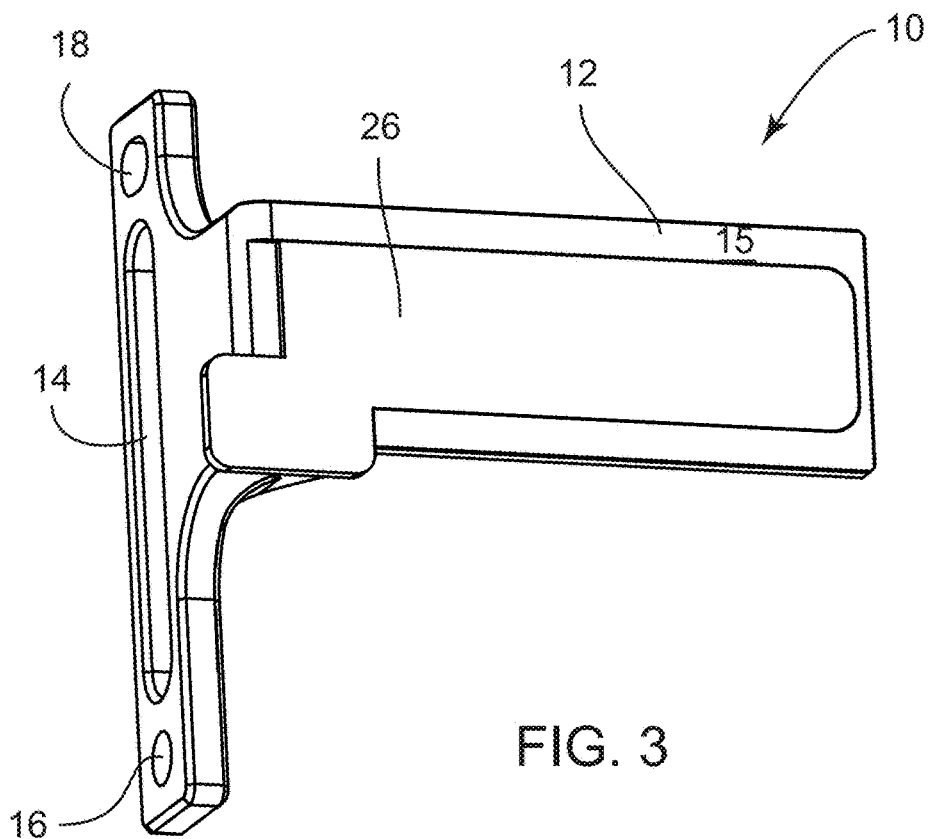
FIG. 3 is another perspective view of a bow cable management device according to an embodiment.
Figure 4:
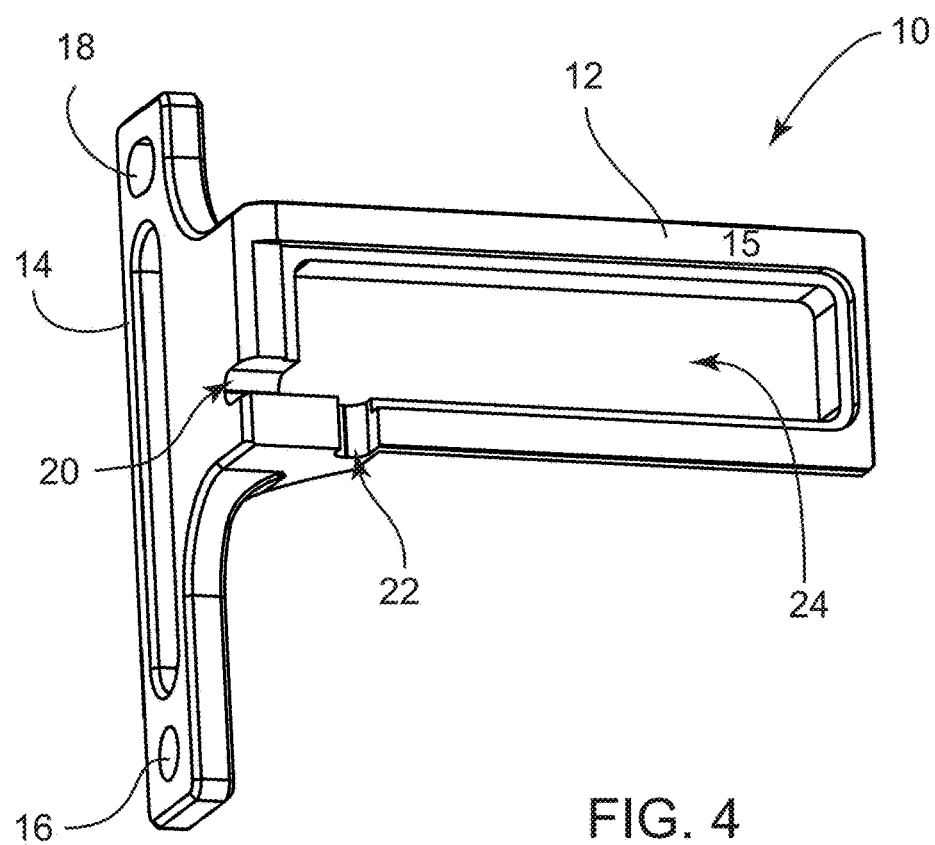
FIG. 4 is yet another perspective view of a bow cable management device according to an embodiment.
Figure 5:
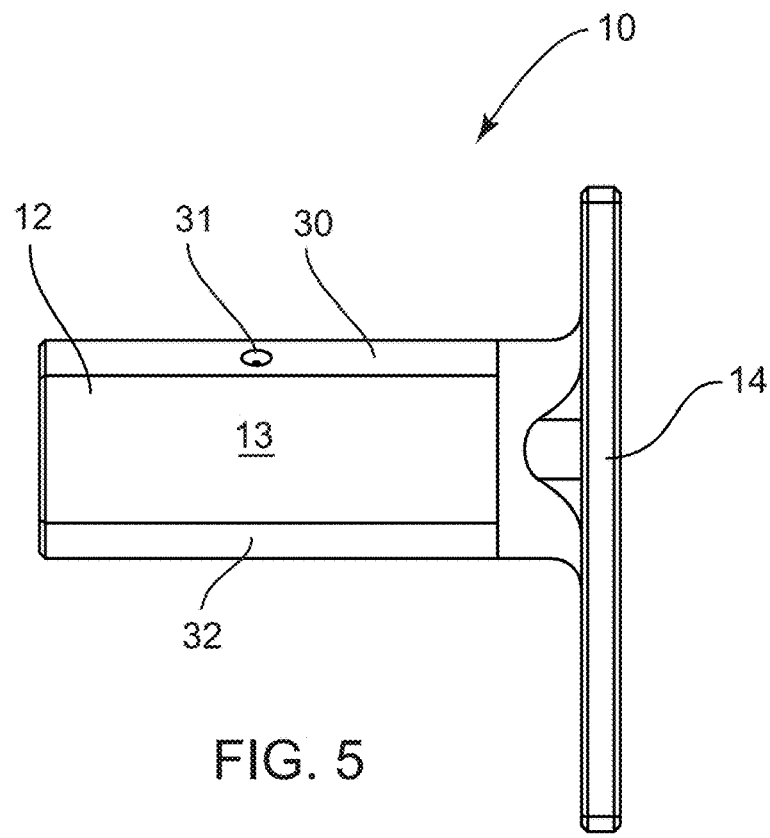
FIG. 5 is a first side view of a bow cable management device according to an embodiment.
Figure 6:
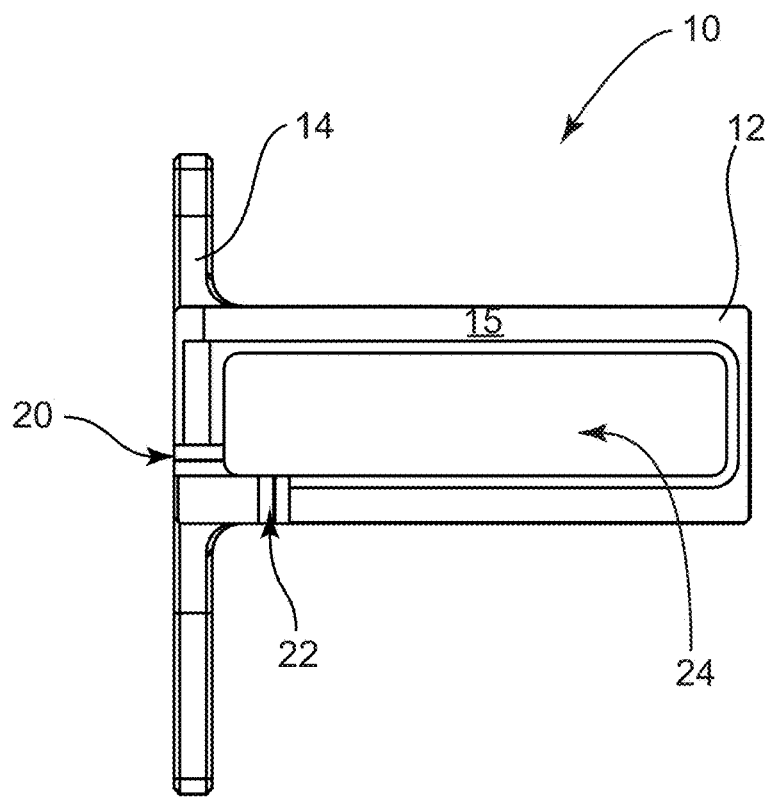
FIG. 6 is a second side view of a bow cable management device according to an embodiment.
Figure 7:
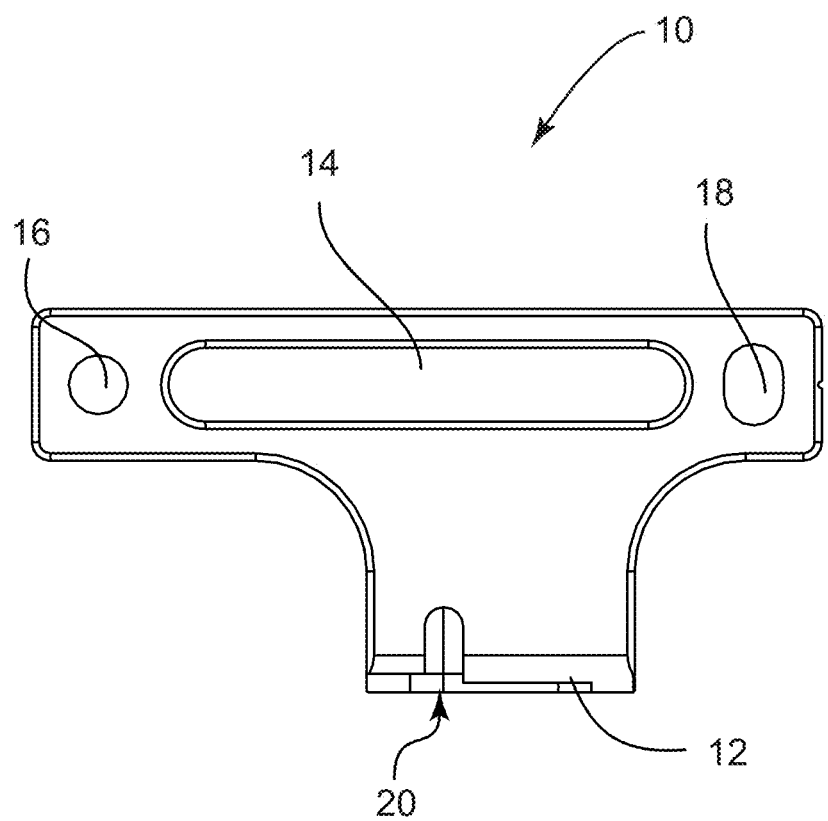
FIG. 7 is a front view of a bow cable management device according to an embodiment.
Figure 8:
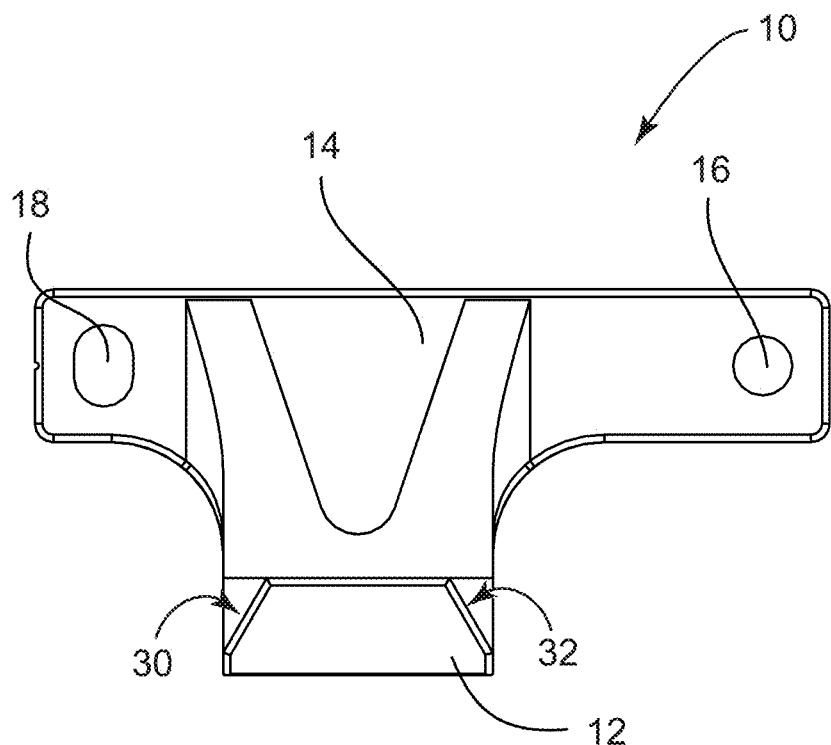
FIG. 8 is a rear view of a bow cable management device according to an embodiment.
Figure 9:
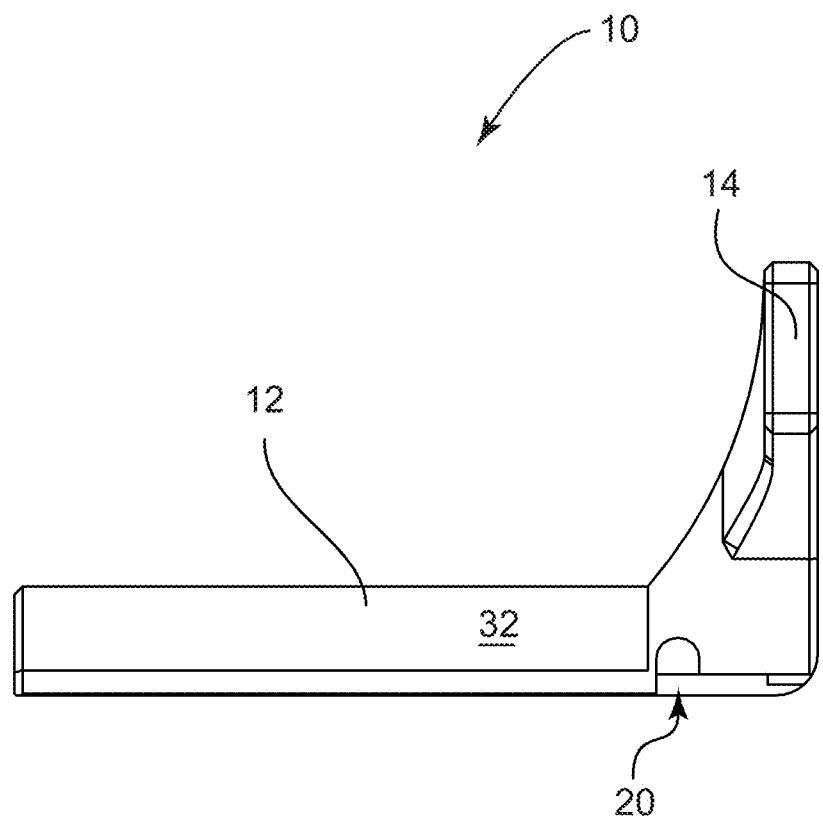
FIG. 9 is a bottom view of a bow cable management device according to an embodiment.
Figure 10:
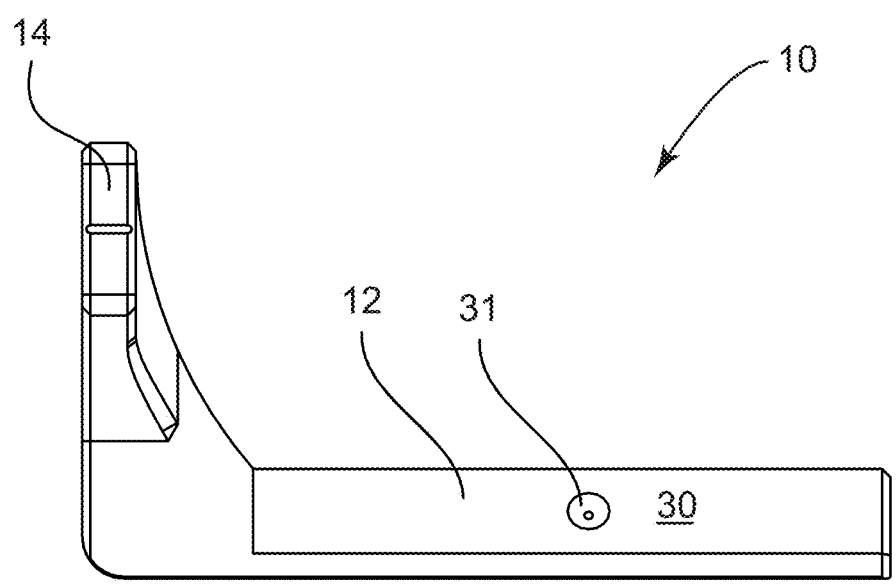
FIG. 10 is a top view of a bow cable management device according to an embodiment.

As discussed above, embodiments of the present invention relate to a bow cable management system that includes a bow cable management device coupled to bow riser and an electronic accessory, wherein the bow cable management device includes means for managing one or more cables of the electronic accessory.

An embodiment of a bow cable management system includes a bow cable management device 10 along with a bow to which the bow cable management device 10 is coupled to and the electronic accessory having a least one cable. FIGS. 1-12 depict an embodiment of the bow cable management device 10.

The bow cable management device 10 comprises a base member 12 having a first side 13 and a second side 15. The base member 12 includes a top chamfered edge 30 and bottom chamfered edge 32 to form a dovetail type shape for coupling to a riser of a bow 60 in a dovetail connection. The bow cable management device 10 further includes a bracket 14 extending away from the first side 13 of the base member 12 and located on a front end of the base member 12. The bracket 14 includes a first aperture 16 and a second aperture 18, wherein the second aperture 18 may be an elongated aperture having an oval shape or an obround shape for adjustability in coupled the bracket 14 to an electronic device or a mount of the electronic device. The base member 12 may include a recess 24 extending into the base member 12 from the second side 15. A first channel 20 is formed in the base member 12 and extends from the recess 24 out the front end of the device 10, and a second channel 22 is formed in the base member 12 and extends from the recess 24 out the bottom side of the base member 12. The recess 24 may be covered by cover member 26.

Figure 11:
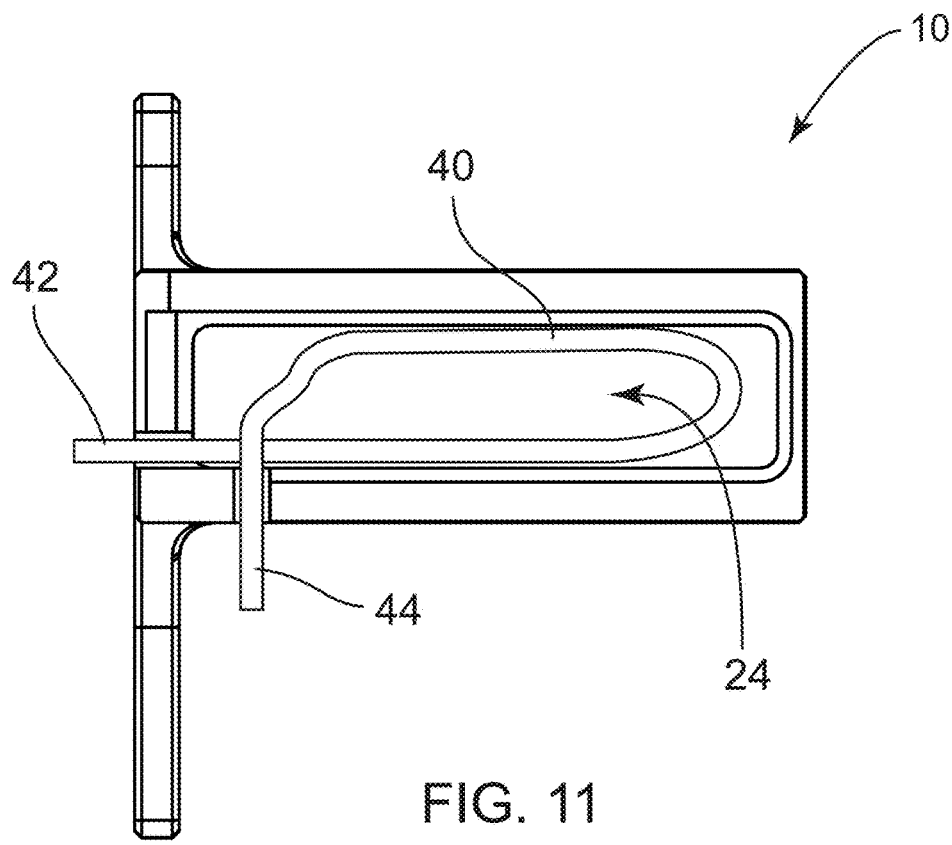
FIG. 11 is a second side view of a bow cable management device with a cable coupled thereto according to an embodiment.
Figure 12:
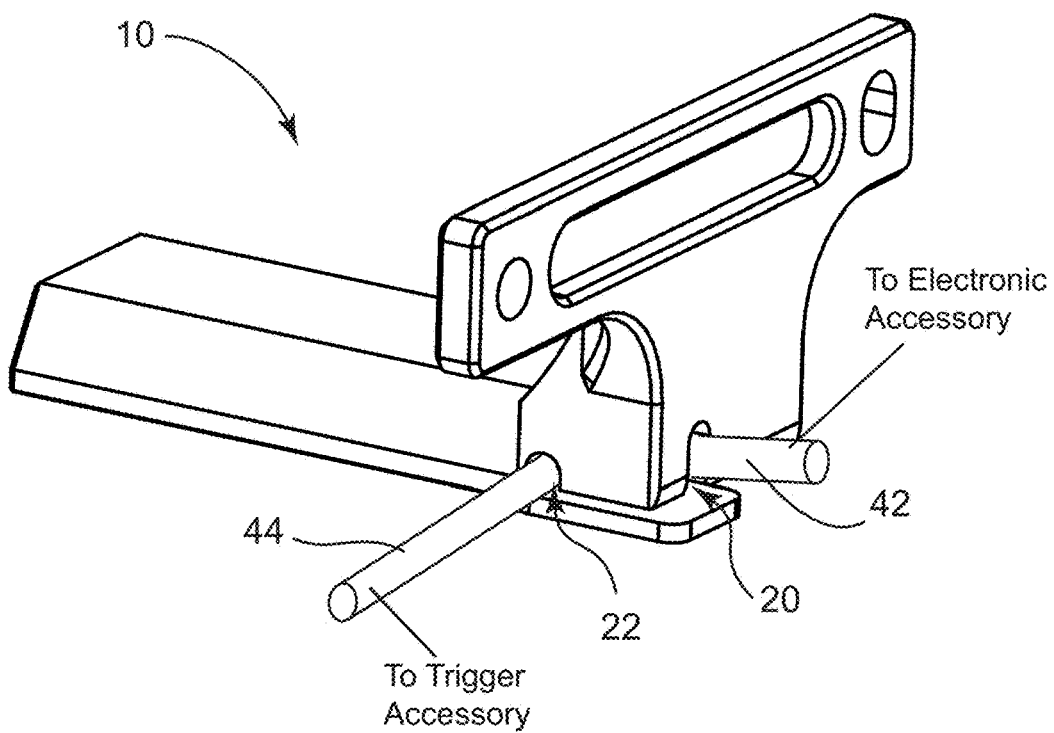
FIG. 12 is a perspective view of a bow cable management device with a cable coupled thereto according to an embodiment.

Referring FIGS. 11-12, the cable management device 10 may be configured to receive a cable 40 of the electronic accessory through first channel with a portion of the cable 40 retained within the recess of the base member and then extending through the second channel. In this way, the cable extends from the electronic accessory, shown as cable portion 42, through the first channel 20 and into recess 24 of the bow cable management device 10 and then extends through the second channel 22, shown as cable portion 44, to a trigger accessory. The cover 26 may be coupled over the recess 24 to keep the cable 40 within the recess of the cable management device 10. Typically, the trigger accessory is coupled at the handle of the bow allowing the user to engage the trigger accessory when holding the bow for shooting. While it is shown with only a single cable, the bow cable management device 10 may be configured to receive more than one cable therein and manage the cables of multiple devices. In other embodiments, multiple bow cable management devices 10 may be incorporated.

Figure 13:
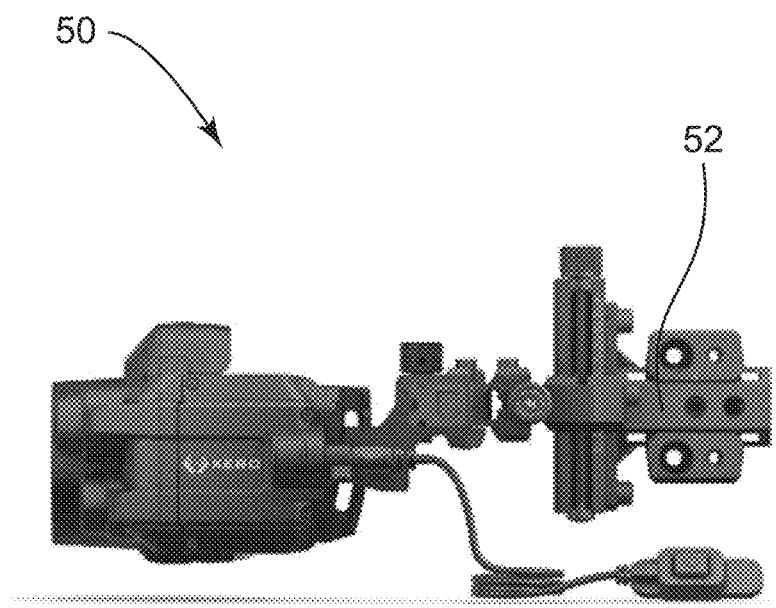
FIG. 13 is a side view of an electronic accessory according to an embodiment.
Figure 14:
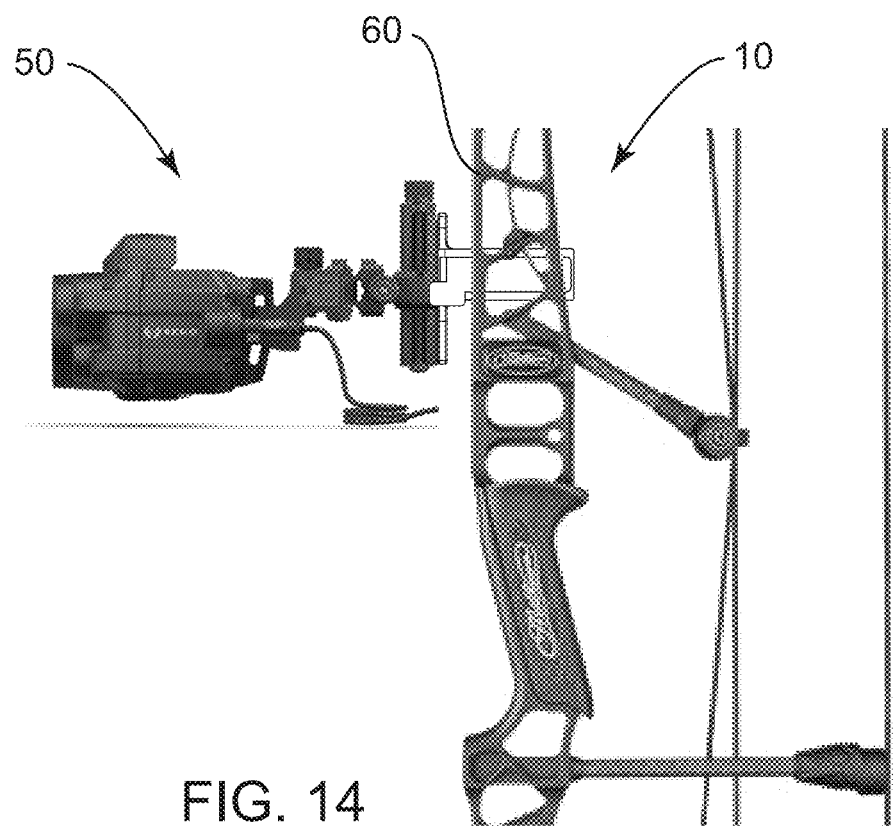
FIG. 14 is a side view of an electronic accessory with a bow cable management device coupled thereto according to an embodiment.

In operation, as shown in FIGS. 13 and 14, an electronic accessory 50, such as the rangefinder sight depicted, may include a mount 52 that engages a bracket. The bow cable management device 10 may replace the mount 52, wherein the chamfered edges 30 and 32 can slide and engage a bridge-lock system formed in the bow riser 60, as shown in FIG. 14. A bridge-lock system allows a dovetail sight to be mounted through the riser of the bow 60, eliminating the need for an external mounting bracket. The riser of the bow 60 includes a slot configured in shape to correspond to a dovetail sight and the base member 12 of the cable management device 10 is a shape with the chamfered edges 30 and 32 to slide within the slot of the bridge-lock system on the bow 60. The cover 26 of the cable management device 10 may be held in place by the bridge-lock system of the bow riser 60, such as being held in place by a portion of the slot in the riser of the bow 60 that the cable management device 10 is slid into. Additionally, the bow cable management device 10 may be secured to the bridge-lock system of the bow riser 60 with a set screw coupled through the riser of the bow 60 and engaging recess 26 that is formed in chamfered edge 30.

While FIG. 14 depicts the use of the bow cable management device 10 with a bridge-lock system, it will be understood that in some embodiments, the bow cable management device 10 may be coupled to a riser of a bow 60 or other location of the bow 60 in other ways. For example, and without limitation, in some embodiments, the bow cable management device 10 may be coupled to a side of the bow riser or bow, and in other embodiments, a mount or bracket of some sort may be coupled to the bow riser or bow and then coupled to the bow cable management device 10. In each instance, the bow cable management device 10 is coupled to the bow riser or bow and operates to manage cables for operation of an electronic accessory.

A method of the use of the bow cable management device 10 may include coupling the bow cable management device 10 to a bow riser with at least one cable 40 have a portion retained within a recess 24 of the bow cable management device 10, the portion of the cable retained within the recess with the bow riser operating to retain the portion of the cable 40 within the recess 24 and a first end 42 of the cable extending through a first channel 20 and a second end 44 of the cable 40 extending through a second channel 22; coupling an electronic accessory 50 to the bow cable management device 10; coupling the first end 42 of the cable 40 to the electronic accessory 50; and coupling the second end 44 of the cable 40 to a trigger accessory (not shown).

Accordingly, the components defining any bow cable management device may be formed of any of many different types of materials or combinations thereof that can readily be formed into shaped objects provided that the components selected are consistent with the intended operation of a bow cable management device. For example, the components may be formed of: rubbers (synthetic and/or natural) and/or other like materials; glasses (such as fiberglass) carbon-fiber, aramid-fiber, any combination thereof, and/or other like materials; polymers such as thermoplastics (such as ABS, Fluoropolymers, Polyacetal, Polyamide; Polycarbonate, Polyethylene, Polysulfone, and/or the like), thermosets (such as Epoxy, Phenolic Resin, Polyimide, Polyurethane, Silicone, and/or the like), any combination thereof, and/or other like materials; composites and/or other like materials; metals, such as zinc, magnesium, titanium, copper, iron, steel, carbon steel, alloy steel, tool steel, stainless steel, aluminum, any combination thereof, and/or other like materials; alloys, such as aluminum alloy, titanium alloy, magnesium alloy, copper alloy, any combination thereof, and/or other like materials; any other suitable material; and/or any combination thereof.

Furthermore, the components defining any bow cable management device may be purchased pre-manufactured or manufactured separately and then assembled together. However, any or all of the components may be manufactured simultaneously and integrally joined with one another. Manufacture of these components separately or simultaneously may involve extrusion, pultrusion, vacuum forming, injection molding, blow molding, resin transfer molding, casting, forging, cold rolling, milling, drilling, reaming, turning, grinding, stamping, cutting, bending, welding, soldering, hardening, riveting, punching, plating, and/or the like. If any of the components are manufactured separately, they may then be coupled with one another in any manner, such as with adhesive, a weld, a fastener (e.g. a bolt, a nut, a screw, a nail, a rivet, a pin, and/or the like), wiring, any combination thereof, and/or the like for example, depending on, among other considerations, the particular material forming the components. Other possible steps might include sand blasting, polishing, powder coating, zinc plating, anodizing, hard anodizing, and/or painting the components for example.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A method of using a cable management system, the method comprising:
   coupling a bow cable management device to a bow riser, the bow cable management device comprising:
      a base member comprising a first side and an opposing second side, a bottom side and a top side, and a front end and a rear end; and
      a recess extending into the base member from the second side, with at least one cable having a portion retained within the recess, a first end of the cable extending through a first channel formed in the front end of the base member and a second end of the cable extending through a second channel formed in the bottom side of the base member;
   coupling an electronic accessory to the bow cable management device;
   coupling a first end of the cable to the electronic accessory; and
   coupling a second end of the cable to a trigger accessory.

2. The method of claim 1, wherein the bow cable management device further comprises:
   a cover member coupled over the recess; and
   a bracket extending from the first side of the base member and located at the front end of the base member.

3. The method of claim 2, further comprising retaining the cover member coupled to the base member over the recess in response to coupling the bow cable management device to the bow riser.

4. The method of claim 2, wherein coupling the electronic accessory to the bow cable management device comprises coupling the electronic accessory to the bracket of the bow cable management device.

5. The method of claim 2, wherein coupling the bow cable management device to the bow riser further comprises coupling the bow cable management device within a bridge-lock slot formed in the bow riser.

6. The method of claim 5, wherein the bow management device further comprises a top chamfered edge and bottom chamfered edge formed in the base member.

7. The method of claim 6, wherein bridge-lock slot comprises a shape corresponding to a shape of the bow management device.

8. A method of using a cable management system, the method comprising:
   coupling a bow cable management device to a bow riser with at least one cable having a portion retained within a recess of the bow cable management device, a first end of the cable extending through a first channel formed in the bow cable management device and a second end of the cable extending through a second channel of the bow cable management device, wherein the recess sized and shaped to retain the portion of at least one cable that is longer than a distance between the first channel and the second channel;
   coupling an electronic accessory to the bow cable management device;
   coupling a first end of the cable to the electronic accessory; and
   coupling a second end of the cable to a trigger accessory.

* * * * *